(12) United States Patent
Wang et al.

(10) Patent No.: US 8,586,432 B2
(45) Date of Patent: Nov. 19, 2013

(54) METHOD FOR MANUFACTURING VERTICAL-CHANNEL TUNNELING TRANSISTOR

(75) Inventors: Pengfei Wang, Shanghai (CN); Xi Lin, Shanghai (CN); Wei Liu, Shanghai (CN); Qingqing Sun, Shanghai (CN); Wei Zhang, Shanghai (CN)

(73) Assignee: FUDAN University, Shanghai (CN)

( * ) Notice: Subject to any disclaimer, the term of this patent is extended or adjusted under 35 U.S.C. 154(b) by 0 days.

(21) Appl. No.: 13/537,854

(22) Filed: Jun. 29, 2012

(65) Prior Publication Data

US 2013/0149848 A1     Jun. 13, 2013

(30) Foreign Application Priority Data

Dec. 12, 2011  (CN) .......................... 2011 1 0410898

(51) Int. Cl.
 *H01L 21/336*     (2006.01)
(52) U.S. Cl.
 USPC .................................. 438/259; 257/E21.623
(58) Field of Classification Search
 USPC ........... 257/E21.682, E21.263, E21.623, 315, 257/E21.609, E21.419; 438/514, 283, 184, 438/176, 157, 259
 See application file for complete search history.

(56) References Cited

U.S. PATENT DOCUMENTS

| | | | |
|---|---|---|---|
| 7,439,572 B2 * | 10/2008 | Chen et al. | 257/315 |
| 7,465,642 B2 * | 12/2008 | Cheng et al. | 438/423 |
| 7,598,563 B2 * | 10/2009 | Kim | 257/316 |
| 7,883,966 B2 * | 2/2011 | Kim | 438/259 |
| 2006/0091449 A1 * | 5/2006 | Chen et al. | 257/315 |
| 2007/0037359 A1 * | 2/2007 | Jo | 438/401 |
| 2007/0178650 A1 * | 8/2007 | Chen et al. | 438/301 |
| 2008/0050881 A1 * | 2/2008 | Chen et al. | 438/301 |
| 2008/0087949 A1 * | 4/2008 | Maruoka et al. | 257/330 |
| 2008/0093649 A1 * | 4/2008 | Kim et al. | 257/315 |
| 2008/0173923 A1 * | 7/2008 | Li et al. | 257/315 |
| 2008/0224224 A1 * | 9/2008 | Vandenderghe et al. | 257/365 |
| 2011/0315960 A1 * | 12/2011 | Goel et al. | 257/24 |
| 2012/0319167 A1 * | 12/2012 | van Dal et al. | 257/192 |

* cited by examiner

*Primary Examiner* — Daniel Luke
*Assistant Examiner* — Latanya N Crawford
(74) *Attorney, Agent, or Firm* — Merchant & Gould P.C.

(57) ABSTRACT

The present invention belongs to the technical field of semiconductors and specifically relates to a method for manufacturing a vertical-channel tunneling transistor. In the present invention, the surrounding gate gate structure improves the control capacity of the gate and the source of narrow band gap material can enhance the device driving current. The method for manufacturing a vertical-channel tunneling transistor put forward by the present invention capable of controlling the channel length precisely features simple process, easy control and reduction of production cost.

14 Claims, 5 Drawing Sheets

METHOD FOR MANUFACTURING VERTICAL-CHANNEL TUNNELING TRANSISTOR

This application claims benefit of Serial No. 201110410898.6, filed 12 Dec. 2011 in China and which application is incorporated herein by reference. To the extent appropriate, a claim of priority is made to the above disclosed application.

BACKGROUND OF THE INVENTION

1. Technical Field

The present invention belongs to the technical field of semiconductor devices, relates to a method for manufacturing a tunneling field effect transistor, and more especially, to a method for manufacturing a vertical-channel tunneling transistor using narrow band gap materials as the source.

2. Description of Related Art

In recent years, microelectronic technology with silicon integrated circuits as their core has developed rapidly, the and the development of the integrated circuit chip basically follows the Moore's law, namely the integration degree of semiconductor chips increases at a speed of doubling every 18 months. However, with the increase of the integration degree of semiconductor chips, the channel length of MOS transistor is also reducing continuously, and the semiconductor chip performances will decline, or even be unable to work due to the short channel effect when the channel length of the MOS transistor becomes extremely short.

The vertical-channel tunneling transistor is a kind of transistor with an extremely small leakage current, which can further minimize the circuit size and decrease voltage, thus reducing the chip power consumption significantly. The channel length of the vertical-channel tunneling transistor is usually determined by the process such as silicon mesa etching, ion implantation and extension, rather than be defined through photoetching as the traditional planar-channel MOS transistor, so the manufacturing of short-channel devices can be easily realized without the aid of complicate photoetching and the process is compatible with that of the planar-channel MOS transistor. In the common silicon mesa process, usually, a silicon mesa is firstly formed through etching and then a channel is formed by implantation. Since the depth of the junction implanted is difficult to control, the channel length is also difficult to control.

BRIEF SUMMARY OF THE INVENTION

The present invention aims at providing a method for manufacturing a vertical-channel tunneling transistor so as to better control the device channel length.

The method for manufacturing a vertical-channel tunneling transistor put forward by the present invention includes the following steps:

provide a semiconductor substrate;
form a first kind of insulation film on the semiconductor substrate;
etch the first kind of insulation film to form a pattern;
form a doping region of a first doping type in the semiconductor substrate;
etch the semiconductor substrate to form a groove;
cover the groove and the first kind of insulation film to form a second kind of insulation film;
cover the second kind of insulation film to form a first kind of conductive film;
etch the first kind of conductive film and the second kind of insulation film to form the device gate structure;
deposit a silicon nitride film on the structure above and etch the silicon nitride film to form a gate protection layer;
etch the first kind of insulation film along the sidewall of the silicon nitride film to expose the substrate;
etch the substrate exposed to form a region for the subsequent development;
develop a layer of narrow band gap material selectively on the structure above;
conduct a second type of doping to the narrow band gap material through ion implantation;
etch the silicon nitride film to form a gate sidewall;
deposit a third kind of insulation film to form a device passivation layer;
etch the third kind of insulation film to form a contact hole;
deposit a second kind of conductive film and etch the second kind of conductive film to form electrodes.

Further, the semiconductor substrate is of silicon or silicon on insulation (SOI). The first and third kinds of insulation film are of silicon oxide or silicon nitride. The second kind of insulation film is of silicon oxide or high-dielectric constant materials such as $HfO_2$.

The first kind of conductive film is of doped polycrystalline silicon with a doping type of n-type or p-type doping. The second kind of conductive film is of metallic aluminum, tungsten or other metallic conductive materials.

The first doping type is n-type doping and the second doping type is p-type doping.

The narrow band gap material is SiGe.

The method for manufacturing a vertical-channel tunneling transistor put forward by the present invention capable of controlling the channel length precisely features simple process, easy control and reduction of production cost.

BRIEF DESCRIPTION OF THE SEVERAL VIEWS OF THE DRAWINGS

FIGS. 1-11 are the process flow diagrams of an embodiment of the method for manufacturing a vertical-channel tunneling transistor put forward by the present invention, wherein FIGS. 3, 5, and 11 are the A-direction view of FIGS. 2, 4 and 10 respectively.

DETAILED DESCRIPTION OF THE INVENTION

Figure 1:
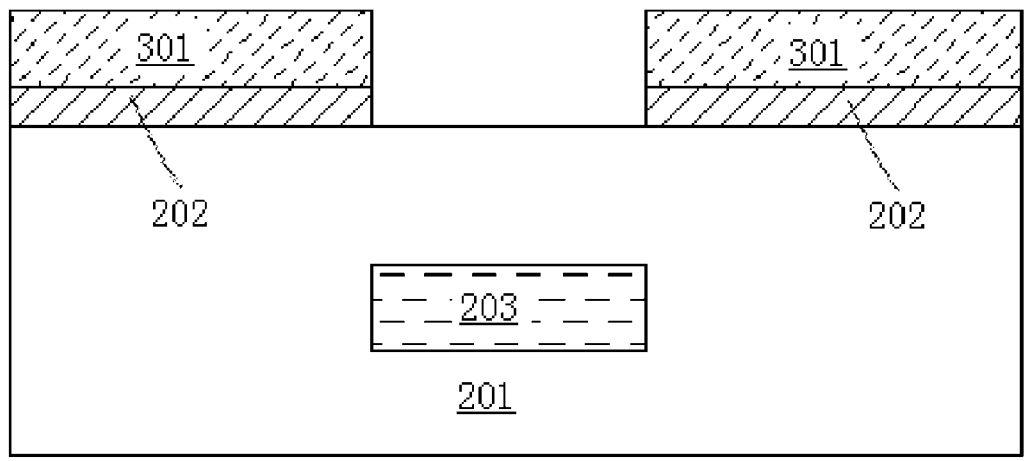

An exemplary embodiment of the present invention is further detailed herein by referring to the drawings. In the drawings, the thicknesses of the layers and regions are either zoomed in for the convenience of description, so they shall not be considered as the true size. Although these drawings cannot accurately reflect the true size, they still reflect the relative positions among the regions and components completely, especially the up-down and adjacent relations.

The reference diagrams are the schematic diagrams of the idealized embodiments of the present invention, so the embodiments shown in the present invention shall not be limited to specific shapes in areas shown in the drawings, while they shall include the obtained shapes such as the deviation caused by manufacturing. For instance, curves obtained through etching are often bent or rounded, while in the embodiments of the present invention, they are all presented in rectangles, and what the drawings present is schematic and shall not be considered as the limit to the present invention. Meanwhile, the term "wafer" and "substrate" used in the following description can be considered as a semiconductor wafer during manufacturing process, and other film layers prepared on it may also be included.

Firstly, develop a layer of silicon dioxide film 202 on a silicon substrate 201 provided through spin-coating or oxidation, then deposit a layer of photoresist 302 on the silicon dioxide film 202, form a pattern through masking film. Exposal and development, etch the silicon oxide film 202 to form a pattern and conduct high-energy ion implantation to form an n-type doping region 203 in the substrate 201, as shown in FIG. 1.

Figure 2:
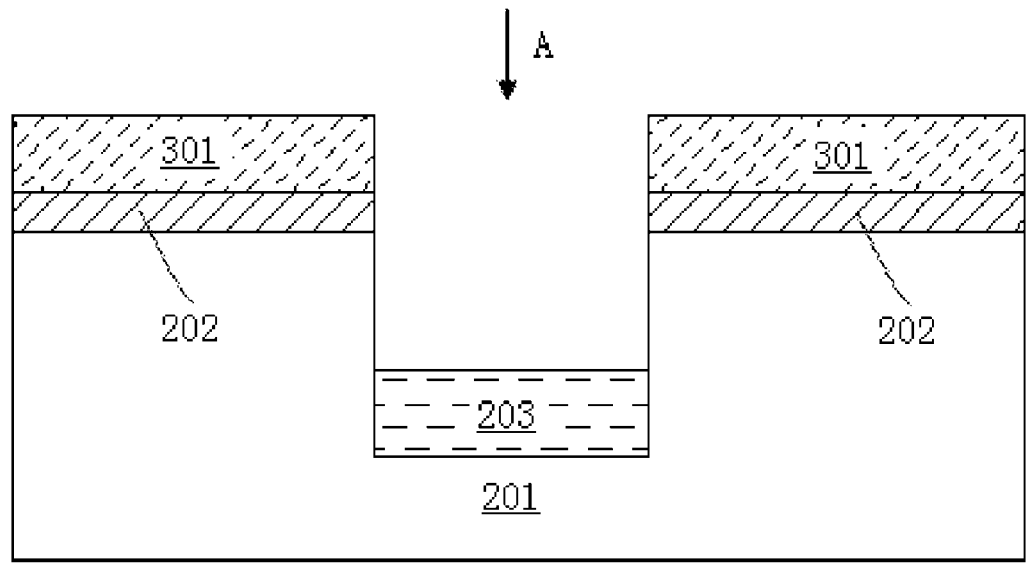
Figure 3:
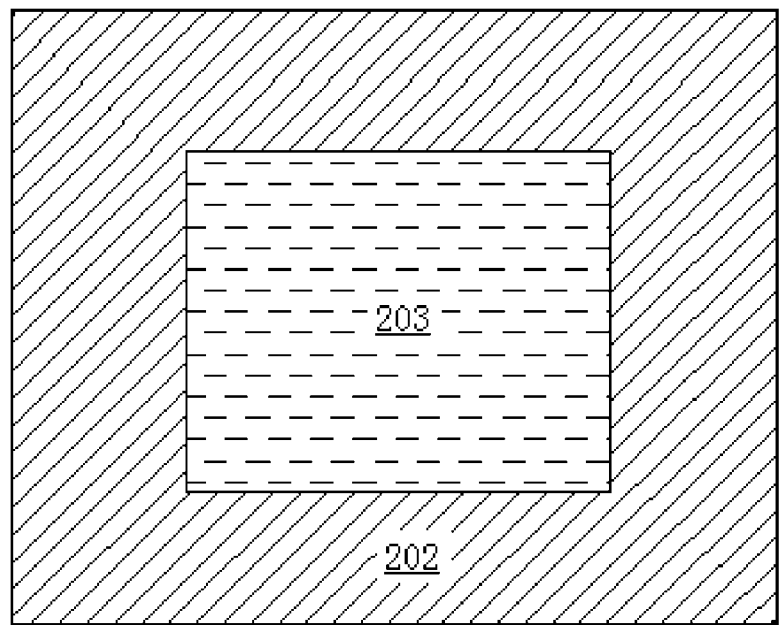

Next, etch the silicon substrate 201 along the sidewall of the silicon dioxide film 202 to form a groove, as shown in FIG. 2, wherein FIG. 3 is the A-direction view of the structure after removing the photoresist shown in FIG. 2.

Figure 4:
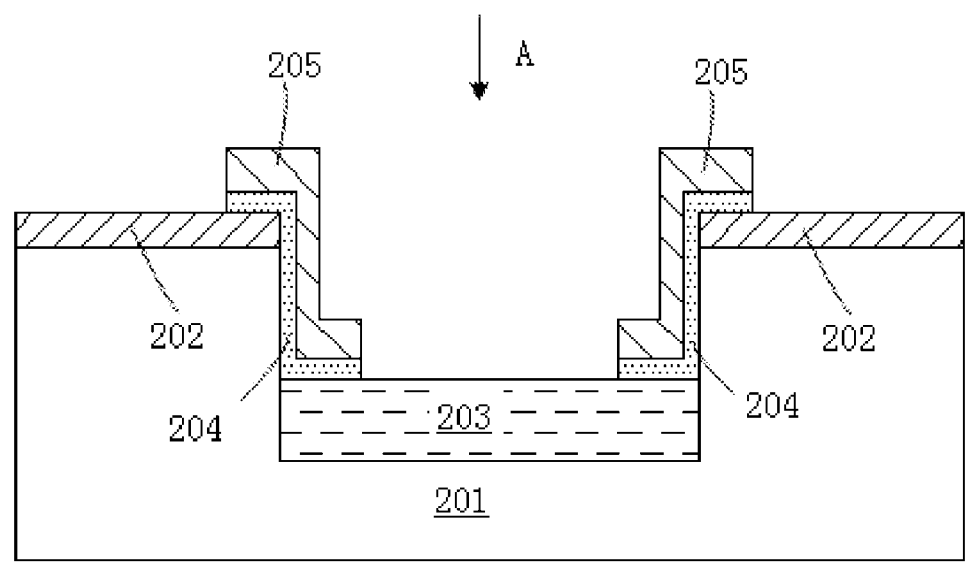
Figure 5:
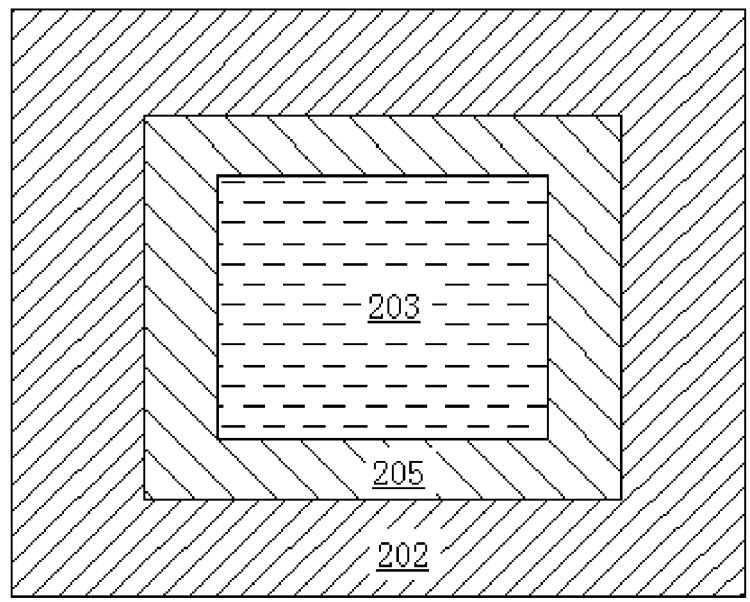

After removing the photoresist 301, deposit a layer of high dielectric constant material 204, such as $HfO_2$, continue to deposit a layer of doped polycrystalline silicon 205 and then form a device gate structure through photoetching and etching, as shown in FIG. 4, wherein FIG. 5 is the A-direction view of the structure shown in FIG. 4.

Figure 6:
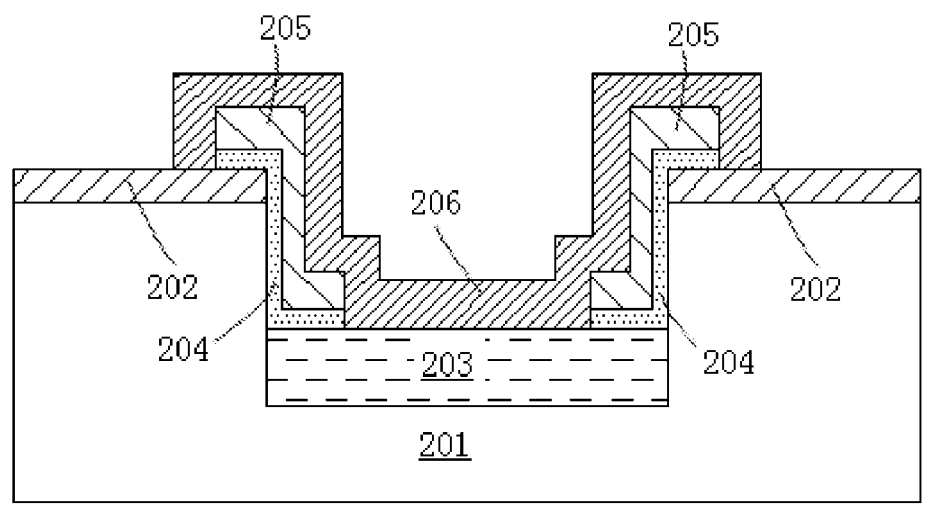
Figure 7:
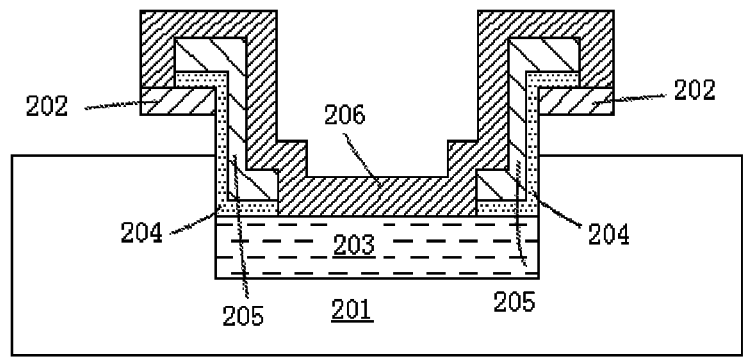

Next, deposit a silicon nitride film and etch the silicon nitride film to form a gate protection layer 206, as shown in FIG. 6. Then etch the silicon dioxide film 202 along the sidewall of the silicon nitride protection layer 206 to expose the substrate 201 and continue to etch the substrate 201 to form a region required for the subsequent development of materials, as shown in FIG. 7.

Figure 8:
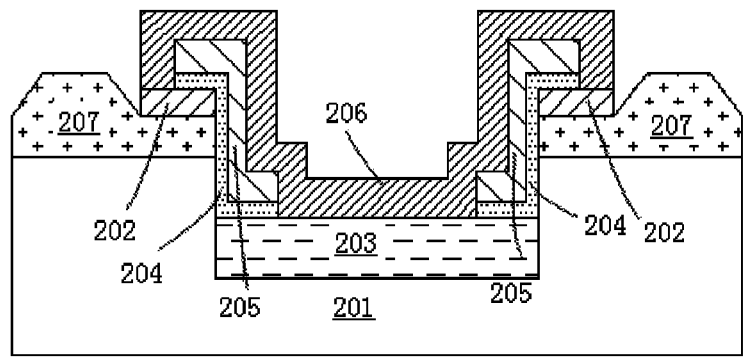
Figure 9:
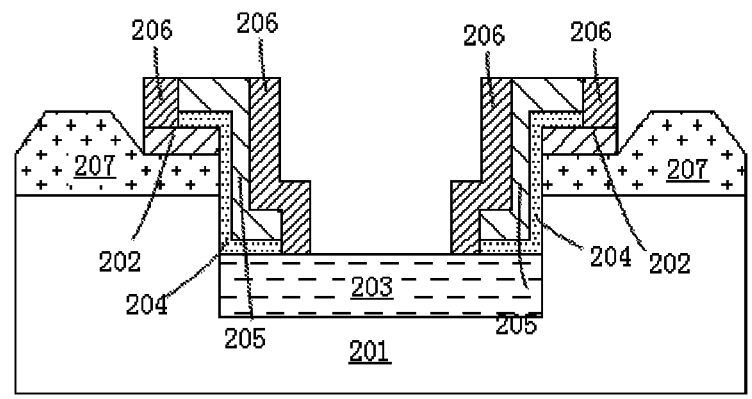

Next, develop a layer of SiGe material selectively and conduct p-type ion implantation to form a device source region 207, as shown in FIG. 8. Then etch the silicon nitride protection layer 206 to form a gate sidewall structure, as shown in FIG. 9.

Figure 10:
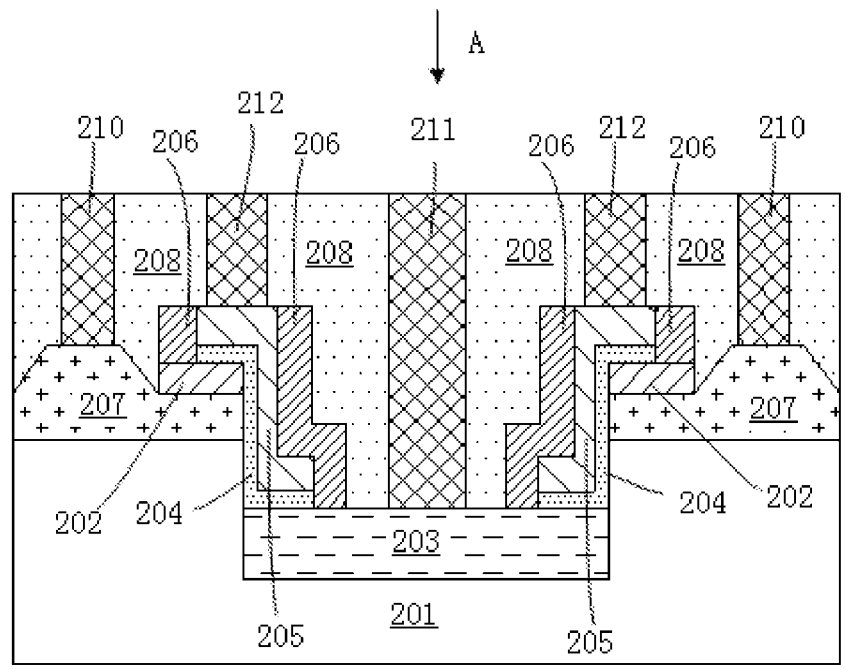
Figure 11:
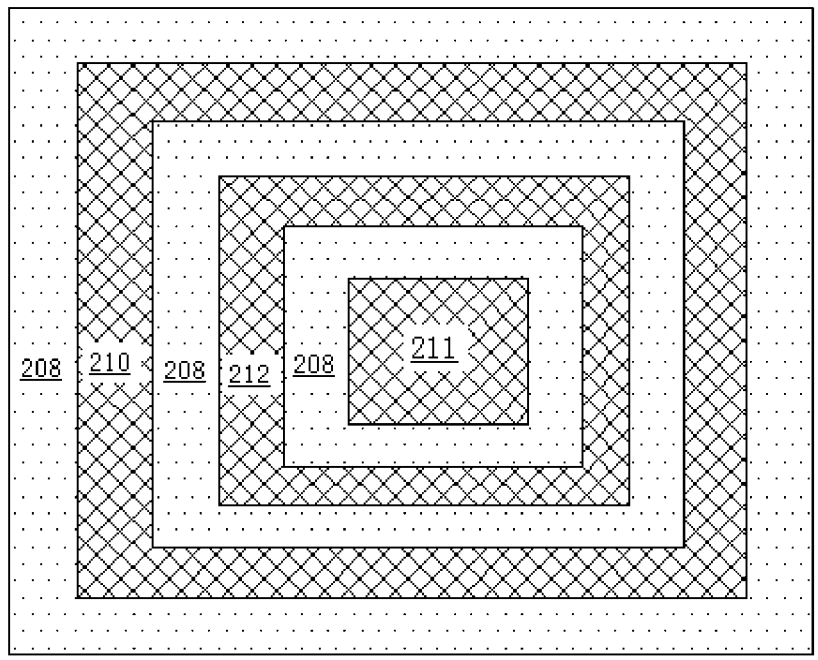

Finally, deposit a layer of insulating material 208 which can be silicon oxide or silicon nitride. Deposit a layer of photoresist again and form a through-hole by masking film, exposal and etching. Then deposit a layer of metal (can be aluminum or tungsten) and etch the metal deposited to form a source electrode 210, a drain electrode 211 and a gate electrode 212 of the device, as shown in FIG. 10, wherein FIG. 11 is the A-direction view if the structure shown in FIG. 10.

As described above, without deviating from the spirit and scope of the present invention, there may be many significantly different embodiments. It shall be understood that the present invention is not limited to the specific embodiments described in the Specification except those limited by the Claims herein.

What is claimed is:

1. A method for manufacturing a vertical-channel tunneling transistor, the method comprising:
   providing a semiconductor substrate;
   forming a first kind of insulation film on the semiconductor substrate;
   etching the first kind of insulation film to form a pattern;
   forming a doping region of a first doping type in the semiconductor substrate;
   etching the semiconductor substrate to form a groove extending from a surface of the substrate to the doping region;
   covering the groove and the first kind of insulation film to form a second kind of insulation film;
   covering the second kind of insulation film to form a first kind of conductive film;
   etching the first kind of conductive film and the second kind of insulation film to form a device gate structure;
   covering the gate structure to form a gate protection layer;
   etching the first kind of insulation film to expose the substrate;
   etching the substrate exposed to form a region for the subsequent development;
   developing a layer of narrow band gap material selectively;
   conducting a second type of doping to the narrow band gap material through ion implantation;
   etching the gate protection layer to form a gate sidewall;
   depositing a third kind of insulation film to form a device passivation layer;
   etching the third kind of insulation film to form a contact hole;
   depositing a second kind of conductive film;
   etching the second kind of conductive film to form electrodes.

2. The method for manufacturing a tunneling transistor according to claim 1, wherein the semiconductor substrate is of silicon or silicon on insulator.

3. The method for manufacturing a tunneling transistor according to claim 1, wherein the first and third kinds of insulation film are of silicon oxide or silicon nitride.

4. The method for manufacturing a tunneling transistor according to claim 1, wherein the second kind of insulation film is of silicon oxide or high-dielectric constant material $HfO_2$.

5. The method for manufacturing a tunneling transistor according to claim 1, wherein the gate protection layer is formed of silicon nitride material.

6. The method for manufacturing a tunneling transistor according to claim 1, wherein the first doping type is n type and the second doping type is p type.

7. The method for manufacturing a tunneling transistor according to claim 1, wherein the first kind of conductive film is of doped polycrystalline silicon with a doping type of n-type or p-type doping.

8. The method for manufacturing a tunneling transistor according to claim 1, wherein the narrow band gap material is of SiGe.

9. The method of claim 1, all steps being carried out sequentially.

10. The method for manufacturing a tunneling transistor according to claim 1, wherein the second kind of conductive film is of metallic aluminum or tungsten.

11. A method for manufacturing a vertical-channel tunneling transistor, the method sequentially comprising:
    forming a first kind of insulation film on a surface of a semiconductor substrate;
    etching the first kind of insulation film to form a pattern;
    forming a doping region of a first doping type in the semiconductor substrate at a depth below the surface of the substrate;
    etching the semiconductor substrate to form a groove extending the depth from the surface of the substrate to the doping region;
    covering the groove and the first kind of insulation film to form a second kind of insulation film;
    covering the second kind of insulation film to form a first kind of conductive film;
    etching the first kind of conductive film and the second kind of insulation film to expose a portion of the doped region and form a device gate structure surrounding the exposed portion;
    covering the gate structure to form a gate protection layer;
    etching the first kind of insulation film to expose the substrate;
    etching the substrate to form a space under the first kind of insulation film for the subsequent development;

depositing a layer of narrow band gap material on the semiconductor substrate, with at least a portion of the narrow band gap material filling the space;

conducting a second type of doping to the narrow band gap material through ion implantation;

etching the gate protection layer to form a gate sidewall;

depositing a third kind of insulation film to form a device passivation layer;

etching the third kind of insulation film to form a contact hole;

depositing a second kind of conductive film;

etching the second kind of conductive film to form electrodes.

12. The method of claim 11, wherein the space under the first kind of insulation film has a depth from the first kind of insulation film, the depth of the groove being greater than the depth of the space.

13. The method of claim 11, all steps being carried out sequentially.

14. The method of claim 12, all steps being carried out sequentially.

* * * * *